United States Patent [19]
Henke

[11] 4,097,036
[45] Jun. 27, 1978

[54] CLAMPING DEVICE FOR A THERMALLY AND ELECTRICALLY PRESSURE-CONTACTED SEMICONDUCTOR COMPONENT IN DISK-CELL CONSTRUCTION

[75] Inventor: Arno Henke, Gorxheimertal, Germany

[73] Assignee: BBC Brown, Boveri & Company, Limited, Mannheim, Germany

[21] Appl. No.: 793,775

[22] Filed: May 4, 1977

[51] Int. Cl.² .............................................. B25B 5/14
[52] U.S. Cl. .................................... 269/254 R; 13/16
[58] Field of Search ........... 269/243, 254 R, 321 WE; 13/16

[56] References Cited
U.S. PATENT DOCUMENTS

| 926,583 | 6/1909 | Miller | 269/246 |
| 1,522,141 | 1/1925 | Raby | 269/246 |
| 2,179,153 | 11/1939 | Jones | 13/16 |

*Primary Examiner*—Robert C. Watson

*Attorney, Agent, or Firm*—Oblon, Fisher, Spivak, McClelland & Maier

[57] ABSTRACT

A clamping device is disclosed for a thermally and electrically pressure-contacted semiconductor component in disk-cell construction which includes two pressure or conductor plates between which the semiconductor component is disposed. The two pressure or conductor plates are squeezed together by a clamping device which includes bolts and flat springs with an adjustable force measurable on the clamping device. The clamping bolts pass through a flat spring and the middle of the spring engages the center of a convex surface on one of the two pressure or conductor plates. A large-area clamping plate with a central threaded insert serves as the flat spring over at least the one pressure or conductor plate. The large-area clamping plate is capable of being stressed over a certain rotation angle proportioned to the force of a central clamping screw which presses on the convex surface. The large-area clamping plate is held by four clamping bolts which pass through the corners of the large-area clamping plate.

6 Claims, 3 Drawing Figures

CLAMPING DEVICE FOR A THERMALLY AND ELECTRICALLY PRESSURE-CONTACTED SEMICONDUCTOR COMPONENT IN DISK-CELL CONSTRUCTION

BACKGROUND OF THE INVENTION

1. Field of the Invention

The invention is concerned with a clamping device for a thermally and electrically pressure-contacted semiconductor component in disk-cell construction with two pressure or conductor plates between which the semiconductor component is placed and which can be squeezed together by means of clamping bolts and flat springs with an adjustable force measurable on the clamping device, the clamping bolts being guided by springs and the center of the spring engaging a convex surface in the center of one pressure or conductor plate.

2. Description of the Prior Art

In a known clamping device of this type, (DT-OS 2,210,180), exact pressure symmetry is obtained by an adjustable force, measurable by the deflection of the ends of the leaf springs, and the localized exertion of this force at the center of the one pressure plate — without rigid coupling. Only with a closely toleranced clamping force and exact pressure symmetry are optimal current and heat transfers at the contact surfaces guaranteed. Of course, the magnitude of the contact force is determined mainly by the necessarily small thermal resistances of the disk-cell itself and the thermal resistances between it and the heat sinks. The sum of all thermal resistances at given temperature gradients is a measure of the current-carrying capacity or the permissible dissipation of the semiconductor element. A closely toleranced clamping force results from the requirement that the contact force is to be proportioned according to the crystal surface and must be held constant within relatively narrow tolerances independent of temperature.

The term "disk-cell construction" or "disk-cell" will be understood in the present connection to mean a semiconductor disk enclosed in an insulating housing with the interposition of conducting plates. Additional conductor plates or heat sinks can be pressure-contacted outside the insulating housing. Such high-power semiconductor components are widely known (e.g. Type CS 500 of Brown Boveri Co., Mannheim or from "VDI-Zeitschrift" 107 (1965) No. 34 - December, p. 1656). From the latter reference, it is further known how to clamp disk cells in heat sinks and, depending on the desired current capacity, to provide them with self-cooling, forced-air cooling or liquid cooling. It is also known how to clamp the heat absorbing sides of heat ducts (DT-OS No. 2,417,106).

SUMMARY OF THE INVENTION

The aim of the invention, starting with the clamping device of the aforementioned type, is to cope with very large disk cells or very large contact forces while maintaining measurability of the force on the clamping device itself and thus a closely toleranced clamping force, the pressure distribution being uniform along the diameter also. Disk-cell contact forces have already reached values of 28 KN and this is not the final limit.

The solution of the problem is that, in accordance with the invention, there serves as a plate spring over at least the one pressure or conducting plate, a large-area clamping plate with a central threaded insert, which clamping plate can be stressed by turning a central clamping screw, pressing against the convex surface, through a certain angle proportioned to the force, the plate being restrained by four clamping bolts passing through its corners.

Preferably a square clamping plate held at all four corners is used.

While in the aforementioned known design (DT-OS No. 2,210,180) the necessary clamping force is obtained by alternate tightening of the nuts on the clamping bolts, only a central screw in the clamping device of the invention need be turned.

The overall height of the clamping device is significantly less than in the case, for example, of known designs with cups, saddle or coil springs (DT-AS No. 1,276,209, DT-AS No. 1,204,751, GB-PS No. 777,985, DT-AS No. 1,248,813), because the spring action is obtained over the large area of the clamping plate. This is also an advantage over the object of DT-OS 2,210,180, because in practical realization of the known design, in order to attain the 18 KN contact pressure mentioned by way of example, three 22 × 4 mm$^2$ leaf springs must be stacked, allowing a spring deflection of only 1.5 mm which, in combination with the visual indicator, can lead to undue departures from the desired spring force.

With other dimensions the same, a contact force of up to 25 KN with about 4 mm spring deflection can be developed with the square clamping plate of the invention, 4 mm thick for example. Because of the softer spring characteristic and elimination of friction between parts, the force is more precisely adjustable. It is also read better visually; for, of course, the position angle of the clamping screw in the clamping plate is marked with the corresponding tolerance limits and thereby the required clamping force on the clamping plate or the pressure on the disk cell can be set. The spring deflection is consequently great enough to maintain the permissible tolerance of customarily +10% of the clamping force.

At higher power levels, the pressure or conductor plates are preferably in the form of liquid-cooled heat sinks of conventional type. As is known, such arrangements permit higher thermal transfer values than do directly air-cooled heat sinks.

While in the known case (DT-OS 2,210,180) the pressure or conductor plates are aligned on the clamping bolts so that, for the sake of pressure symmetry, the convex surface on the one pressure plate has its point of contact exactly on the axis of symmetry, in the clamping device of the invention, the central clamping screw is held exactly on the symmetry axis and the heat sinks, which are not aligned on the draw bolts, are arranged symmetrically with respect to the central axis of the disk cell and symmetrically with respect to the midplane in the clamping direction. Since there is likewise no rigid coupling between the convex surface and the clamping screw, there is guaranteed a symmetrical pressure distribution in the clamping device of the invention also.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

Figure 1:
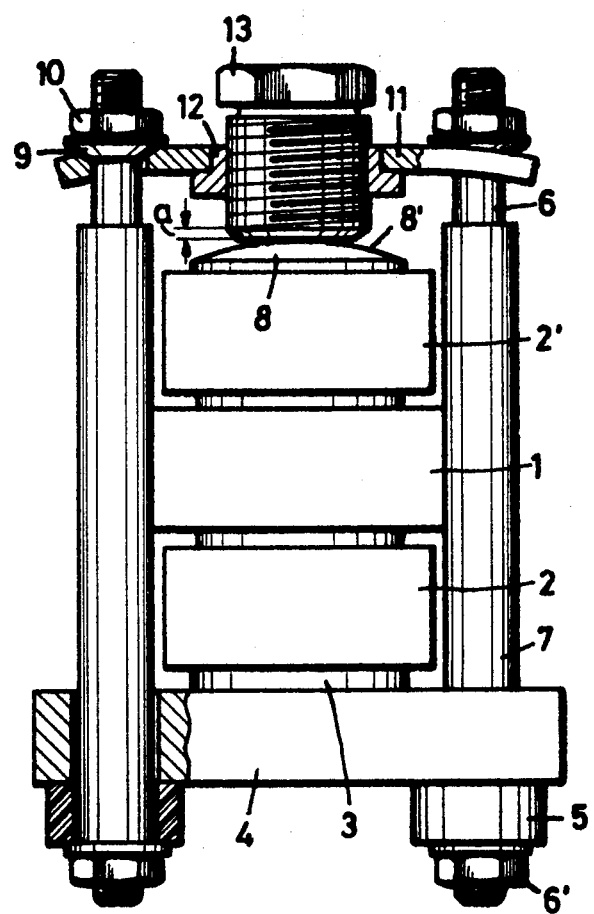
FIG. 1 shows a clamping device for a pressure-contacted semiconductor component in disk-cell construction with two head-sink capsules for liquid cooling.

Referring now to the drawings, wherein like reference numerals designate identical or corresponding parts throughout the several views, and more particularly, to FIG. 1 thereof, the disk cell 1 lies between two cooling capsules 2, one of which is supported on a pedestal 3 on a transom 4. This is provided with four insulating pieces 5 through which the draw rods or clamping bolts 6 pass and the latter are furnished with nuts 6'. The draw rods 6 are insulated from the transom 4 by insulating tubes 7. On the upper cooling capsule 2' shown in the drawing there is a pedestal 8 with a convex surface 8' on which a clamping screw 13 presses. The reaction force of the clamping screw 13 is transmitted by way of a threaded insert 12 to a large-area, square clamping plate 11 which in turn is stressed by convex washers 9 and nuts 10 on the threaded upper ends of draw rods 6.

The clamping process is as follows: With the clamping screw 13 backed off by an amount $a$, the nuts 10 are screwed on by hand, after mounting the clamping or spring plate 11, until the clamping screw 13 is held in positive contact with the pedestal 8. The clamping screw is then turned through a definite angle $\alpha$ to produce, in accordance with the thread pitch, a screw advance by the amount $a$, resulting, in accordance with the spring stiffness $c$, in the required clamping force F, i.e. the angle $\alpha$ is a measure of the magnitude of the clamping force F.

Depending on the size of the semiconductor component, the contact force can range from 5 to 28 KN. The clamping plate 11 covers this range because it conveniently exhibits a flat spring characteristic.

Figure 2:
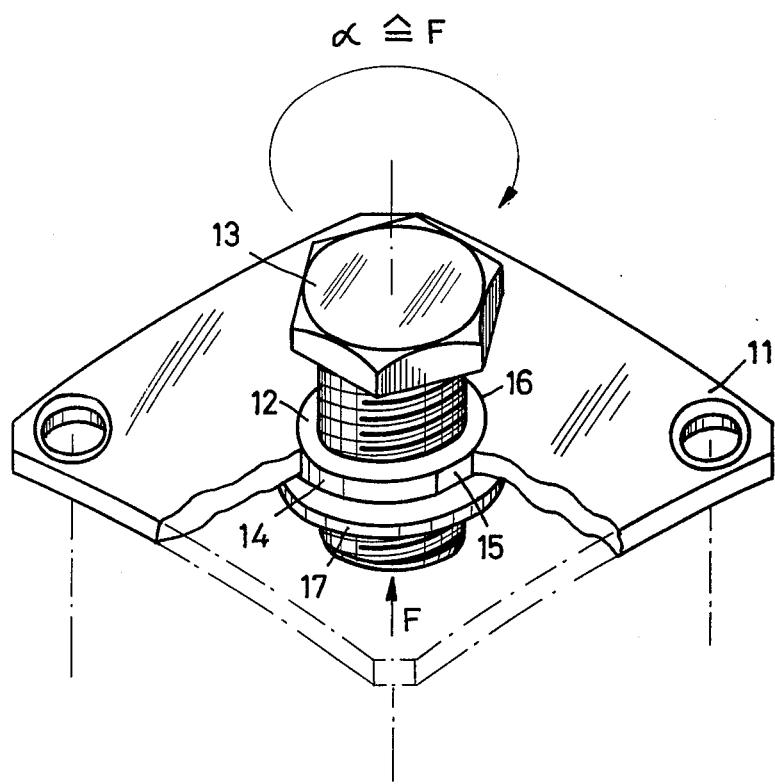
FIG. 2 is a partial perspective view from above of the clamping device of FIG. 1.

To keep the threaded insert 12 from turning in the spring plate 11, its round body 14 is provided with flats 15 on two opposite sides (FIG. 2). Its seating hole 16 in the clamping plate 11 is correspondingly shaped to fit. The threaded insert 12 is supported at the clamping plate 11 by a shoulder 17.

Figure 3:
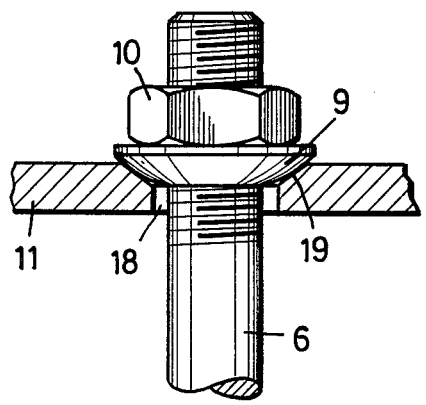
FIG. 3 is a detail of a draw bolt at a clamping plate.

The draw bolts 6 fit through holes 18 in the clamping plate 11 (FIG. 3). These holes are countersunk to receive the convex washers 9. This ensures that the draw rods 6 will not be subjected to bending forces and can freely stress the clamping plate within predetermined tolerances. In case several disk cells 1 and cooling capsules 2, 2' are stacked in a self-evident manner, it is advantageous to replace the transom 4 with a second leaf spring or spring plate to allow for the resulting greater thermal expansion.

As a further refinement, it is possible, with direct air cooling, to anchor the draw rods 6 in the form of stud bolts directly in one of the pressure or conductor plates and employ the electrical insulating on the side of the plate spring 11.

Further, the pressure or conductor plates can also be heat absorbing ends of heat pipes, as shown for example from the journal "Chemie-Ingenieur-Technik" vol. 41, 1969, pp. 30–37 and in connection with thyristor cooling from the above mentioned literature.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A clamping device for a thermally and electrically pressure-contacted semiconductor component in disk-cell construction comprising two pressure or conductor plates in the form of liquid-cooled capsules between which the semiconductor component is disposed, the two liquid-cooled capsules being squeezed together by a clamping device comprising four clamping bolts passing through the corners of a large-area resilient clamping plate with a central threaded insert and a central clamping screw pressing on a convex surface of one of the two liquid-cooled capsules, the clamping screw being screwed over a certain rotation angle measurable on the clamping device, stressing the clamping plate and pressing on the convex surface with a force proportional to said angle.

2. A clamping device as in claim 1 further comprising a seating hole in the center of the clamping plate in which the otherwise round body of the threaded insert is held so as not to rotate by flats on two sides of the otherwise round body, the threaded insert having underneath the clamping plate a shoulder of greater diameter than its body.

3. A clamping device as in claim 1 further comprising convex washers seated in countersunk holes in the clamping plate permitting the clamping bolts to engage the clamping plate.

4. A clamping device as in claim 1 wherein the clamping plate has a flat spring characteristic over a wide contact-force range.

5. A clamping device as in claim 1 further comprising a large-area transom held by the clamping bolts to support the other pressure or conductor plate.

6. A clamping device as in claim 5 wherein the transom is a leaf spring or clamping plate.

* * * * *